United States Patent
Kim et al.

(10) Patent No.: US 12,024,774 B2
(45) Date of Patent: Jul. 2, 2024

(54) APPARATUS FOR SUPPLYING GAS AND APPARATUS FOR PROCESSING SUBSTRATE USING THE SAME

(71) Applicant: JUSUNG ENGINEERING CO., LTD., Gwangju-si (KR)

(72) Inventors: Ki Bum Kim, Gwangju-si (KR); Yun Gyu Ha, Yongin-si (KR); Jong Sik Kim, Gwangju-si (KR); Il Hyung Cho, Yongin-si (KR); Chul Joo Hwang, Seongnam-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 122 days.

(21) Appl. No.: 17/633,577

(22) PCT Filed: Aug. 6, 2020

(86) PCT No.: PCT/KR2020/010425
§ 371 (c)(1),
(2) Date: Feb. 7, 2022

(87) PCT Pub. No.: WO2021/025498
PCT Pub. Date: Feb. 11, 2021

(65) Prior Publication Data
US 2022/0307136 A1    Sep. 29, 2022

(30) Foreign Application Priority Data
Aug. 7, 2019  (KR) .................. 10-2019-0095940

(51) Int. Cl.
*C23C 16/40*     (2006.01)
*C23C 16/455*    (2006.01)
*H01J 37/32*     (2006.01)

(52) U.S. Cl.
CPC .. *C23C 16/45561* (2013.01); *C23C 16/45544* (2013.01); *H01J 37/3244* (2013.01); *H01J 2237/332* (2013.01)

(58) Field of Classification Search
CPC ........ C23C 16/45561; C23C 16/45544; C23C 16/45525; H01J 37/3244; H01J 2237/332;
(Continued)

(56) References Cited

U.S. PATENT DOCUMENTS 4,747,367 A  *  5/1988  Posa ................. C23C 16/45561
                                                  118/725
6,176,198 B1     1/2001  Kao et al.
(Continued)

FOREIGN PATENT DOCUMENTS

JP    H10256166 A    9/1998
KR    100810119 B1   3/2008
(Continued)

OTHER PUBLICATIONS

International Search Report for PCT/KR2020/010425 mailed Nov. 9, 2020.

*Primary Examiner* — Rudy Zervigon
(74) *Attorney, Agent, or Firm* — Renaissance IP Law Group LLP

(57) ABSTRACT

A gas introduction apparatus according to an embodiment of the present disclosure includes a gas feeding block disposed above a chamber, the gas feeding block comprising a plurality of gas channels disposed therein to supply a gas to the chamber, a valve assembly coupled to one side surface of the gas feeding block, the valve assembly comprising a plurality of valves for selectively opening/closing at least one of the plurality of gas channels, and a gas introduction pipe coupled, at one end thereof, to the valve assembly while communicating with the chamber at the other end thereof. A buffer space is provided at least one of the plurality of gas
(Continued)

channels such that the buffer space is disposed adjacent to the gas introduction pipe, to accumulate the gas.

9 Claims, 6 Drawing Sheets

(58) Field of Classification Search
CPC ... H01L 21/02; H01L 21/67; H01L 21/67017; H01L 21/67098; H01L 21/0228
USPC .......................... 118/715; 156/345.31, 345.32
See application file for complete search history.

(56) References Cited

U.S. PATENT DOCUMENTS

| | | | |
|---|---|---|---|
| 6,303,501 | B1 | 10/2001 | Chen et al. |
| 9,574,268 | B1* | 2/2017 | Dunn ................ C23C 16/45512 |
| 2003/0101938 | A1 | 6/2003 | Ronsse et al. |
| 2003/0190423 | A1 | 10/2003 | Yang et al. |
| 2007/0194470 | A1 | 8/2007 | DeDontney |
| 2011/0223334 | A1* | 9/2011 | Yudovsky .......... C23C 16/45504 118/715 |
| 2017/0021317 | A1* | 1/2017 | Shareef ................ B01F 33/841 |
| 2017/0350011 | A1* | 12/2017 | Marquardt ........ C23C 16/45544 |

FOREIGN PATENT DOCUMENTS

| | | |
|---|---|---|
| KR | 101474879 B1 | 12/2014 |
| KR | 101599344 B1 | 3/2016 |
| KR | 20170006178 A | 1/2017 |
| KR | 20170019419 A | 2/2017 |
| KR | 20180021526 A | 3/2018 |
| KR | 20190057695 A | 5/2019 |

* cited by examiner

APPARATUS FOR SUPPLYING GAS AND APPARATUS FOR PROCESSING SUBSTRATE USING THE SAME

TECHNICAL FIELD

The present disclosure relates to a gas introduction apparatus and a substrate processing apparatus using the same.

BACKGROUND ART

In order to deposit a thin film having a certain thickness on a semiconductor substrate, thin film fabrication methods using physical vapor deposition (PVD) utilizing physical collision, such as sputtering, chemical vapor deposition (CVD), etc. are generally used.

In accordance with an ultra-fine design rule of semiconductor devices, a thin film having a fine pattern has been required. The step in a region where such a thin film is formed has been enlarged. To this end, use of atomic layer deposition (ALD) capable of greatly uniformly forming a fine pattern with an atomic layer thickness while exhibiting excellent step coverage is increasing.

ALD may precisely adjust the thickness of a thin film on a substrate surface by suppressing a gas-phase reaction while inducing a self-limited reaction to be carried out on the substrate surface through injection of source gas, purge gas and reactant gas in a time division manner. Accordingly, it may be possible to uniformly form a thin film not only at the surface of a capacitor having a great step, but also at the surface of a particulate structure. Furthermore, ALD may have features in that an increase in the density of a thin film and a reduction in deposition temperature may be achieved. However, although ALD is highlighted in that a uniform thin film may be obtained through a self-limited reaction, various process parameters should be carefully controlled in order to secure a high-quality thin film through ALD.

In particular, in existing ALD apparatuses, the flow time of gas injected into a chamber may be long and, as such, injection of reactant gas may occur in a state in which a source gas is insufficiently purged. For this reason or other reasons, there may be a possibility that an ALD reaction transitions to a CVD reaction in a gas phase. As a result, there may be a problem in that a thin film having a uniform thickness cannot be secured. Furthermore, the amount of the source gas physically adsorbed to the substrate is small, and the deposition time is long. As a result, there may be a problem of degradation in productivity.

DISCLOSURE

Technical Problem

Accordingly, the present disclosure is directed to a gas introduction apparatus and a substrate processing apparatus using the same that substantially obviate one or more problems due to limitations and disadvantages of the related art.

Embodiments of the present disclosure provide a substrate processing apparatus capable of not only reducing the feeding time of gas introduced into a chamber, but also securing a desired thin film deposition rate and thin film thickness uniformity through injection of a great amount of gas.

Additional advantages, objects, and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

Technical Solution

To achieve these objects and other advantages and in accordance with the purpose of the present disclosure, as embodied and broadly described herein, a gas introduction apparatus includes a gas feeding block disposed above a chamber, the gas feeding block including a plurality of gas channels disposed therein to supply a gas to the chamber, a valve assembly coupled to one side surface of the gas feeding block, the valve assembly including a plurality of valves for selectively opening/closing at least one of the plurality of gas channels, and a gas introduction pipe coupled, at one end thereof, to the valve assembly while communicating with the chamber at the other end thereof, wherein a buffer space is provided at least one of the plurality of gas channels such that the buffer space is disposed adjacent to the gas introduction pipe, to accumulate the gas.

The gas may include a process gas and a purge gas. The gas channel supplying the process gas from among the plurality of gas channels may be disposed nearer to the chamber than the gas channel supplying the purge gas from among the plurality of gas channels.

The plurality of gas channels may include a first gas channel for supplying a process gas, a second gas channel for supplying a first purge gas, and a third gas channel for supplying a second purge gas. The third gas channel may be disposed between the first gas channel and the second gas channel.

The buffer space may include a first buffer space provided at the first gas channel, and a second buffer space provided at the third gas channel. The first and second buffer spaces may differ from each other in terms of at least one of volume, length or diameter.

The second gas channel may have a smaller volume than the first and third gas channels.

The gas feeding block may include a heater for heating the gas channel.

The gas feeding block may further include a spacer block disposed at least one side of the buffer space to variably adjust a volume of the gas channel.

Advantageous Effects

Embodiments of the present disclosure provide a substrate processing apparatus capable of not only reducing the feeding time of gas introduced into a chamber, but also securing a desired thin film deposition rate and thin film thickness uniformity through injection of a great amount of gas.

It is to be understood that both the foregoing general description and the following detailed description of the present disclosure are exemplary and explanatory and are intended to provide further explanation of the present disclosure as claimed.

BRIEF DESCRIPTION OF DRAWINGS

The accompanying drawings, which are included to provide a further understanding of the present disclosure and are incorporated in and constitute a part of this application, illustrate embodiment (s) of the present disclosure and along with the description serve to explain the principle of the present disclosure. In the drawings.

BEST MODE

Figure 1:
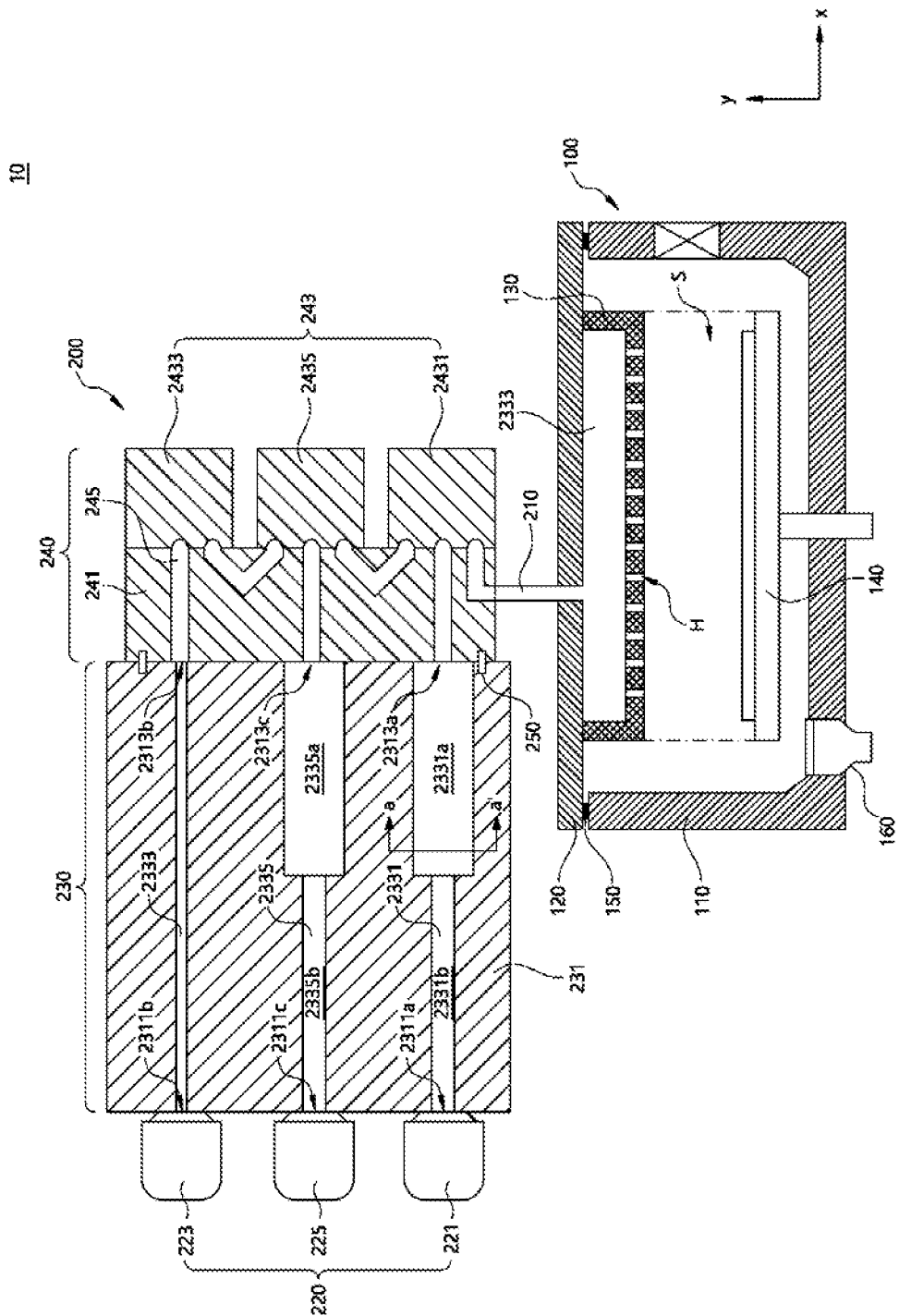
FIG. 1 is a view schematically illustrating a configuration of a substrate processing apparatus according to an exemplary embodiment of the present disclosure.

Hereinafter, embodiments capable of concretely accomplishing the above-described objects will be described in detail with reference to the accompanying drawings. Embodiments may be variously varied and may have various forms. In connection with this, specific embodiments will be illustrated in the drawings, and will be described in detail in the specification.

It will be understood that, although the terms "first," "second," etc. may be used herein to describe various elements, these elements should not be limited by these terms. In addition, it will be understood that relative terms used hereinafter such as "on"/"above"/"over" and "under"/"below"/"beneath" may be construed only to distinguish one element from another element without necessarily requiring or involving a certain physical or logical relation or sequence between the elements.

The terminology used in the present disclosure is for the purpose of describing particular embodiments only and is not intended to limit the disclosure. The singular expressions in the present specification include the plural expressions unless clearly specified otherwise in context.

Hereinafter, a substrate processing apparatus according to an embodiment of the present disclosure will be described with reference to the accompanying drawings. Although the substrate processing apparatus according to the embodiment will be described using a Cartesian coordinate system, the substrate processing apparatus is not limited thereto. That is, although an x-axis and a y-axis are orthogonal to each other in accordance with the Cartesian coordinate system, embodiments are not limited thereto, and the x-axis and the y-axis may intersect each other.

FIG. 1 is a view schematically illustrating a configuration of a substrate processing apparatus according to an exemplary embodiment of the present disclosure.

Figure 2A:
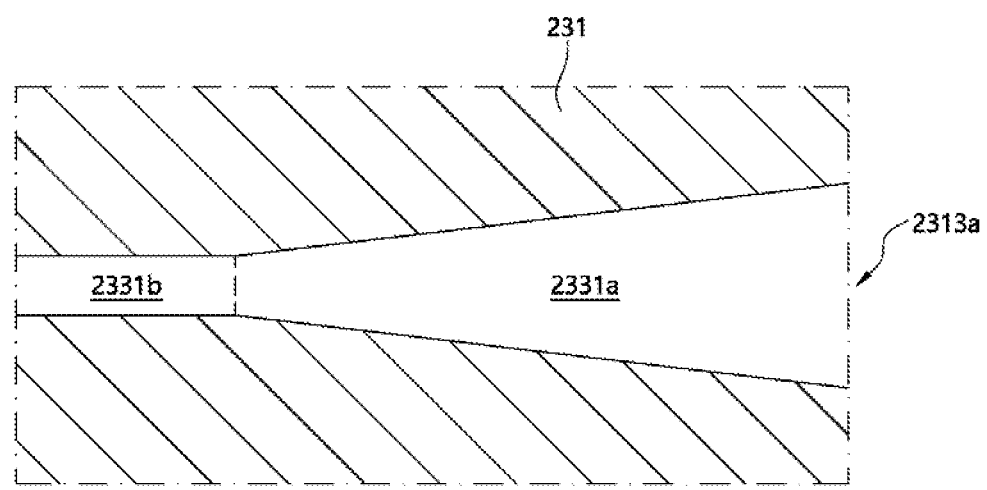
FIG. 2 is a view explaining another embodiment of a gas channel illustrated in FIG. 1.
Figure 2B:
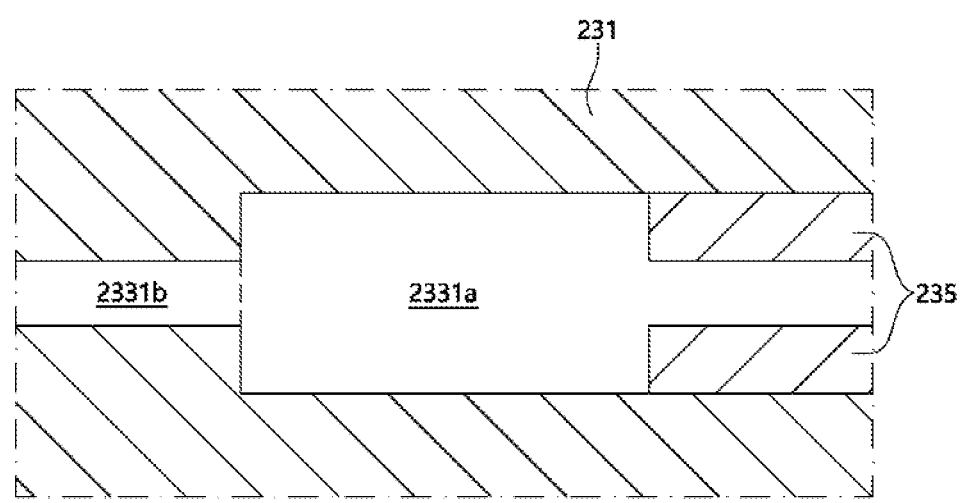

FIGS. 2(a) and 2(b) are views explaining another embodiment of a gas channel illustrated in FIG. 1.

Figure 3A:
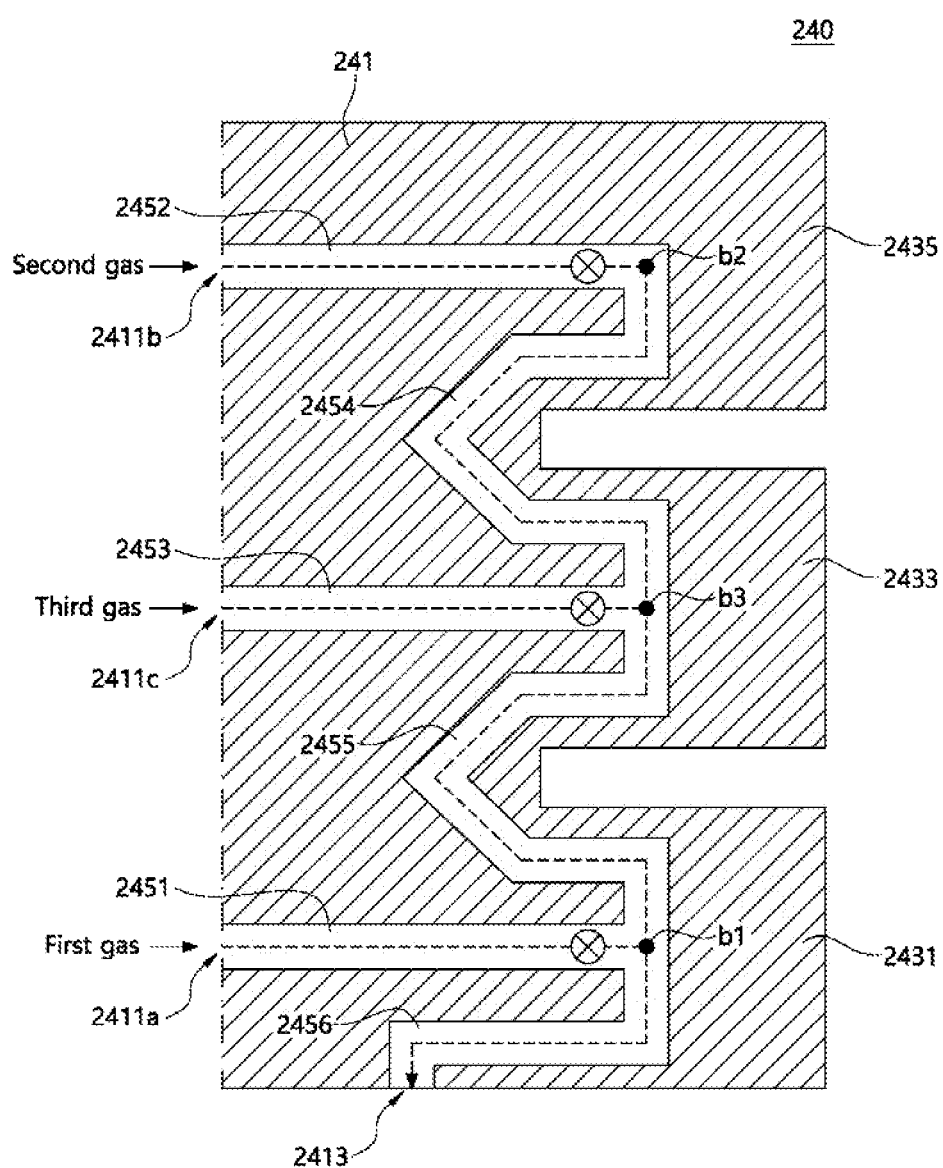
FIG. 3(a) is an enlarged view of a valve assembly illustrated in FIG. 1.
Figure 3B:
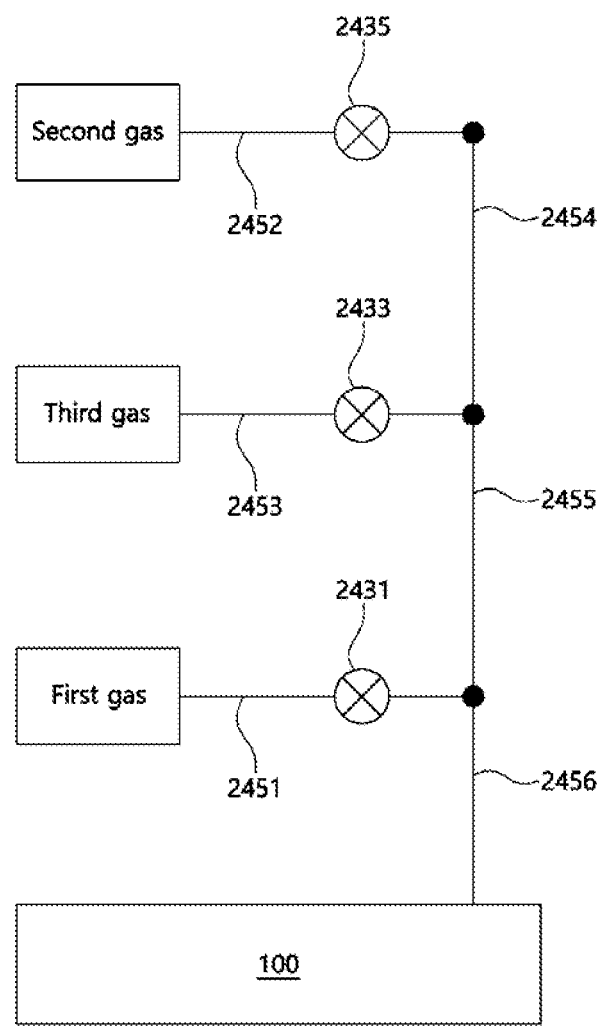
FIG. 3(b) is a view explaining a gas supply path of a gas introduction apparatus according to an exemplary embodiment of the present disclosure.

FIG. 3(a) is an enlarged view of a valve assembly illustrated in FIG. 1. FIG. 3(b) is a view explaining a gas supply path of a gas introduction apparatus according to an exemplary embodiment of the present disclosure.

Referring to FIG. 1, a substrate processing apparatus 10 according to the exemplary embodiment of the present disclosure may include a process chamber 100, and a gas introduction apparatus 200 configured to communicate with the process chamber 100 in order to supply gas for substrate processing to the process chamber 100.

The process chamber 100 may include a chamber body 110, a lid 120 provided at an upper surface of the chamber body 110, and a gas injector 130 disposed in an inner space defined by the chamber body 110 and the lid 120 while being provided with a plurality of gas injection holes H. The process chamber 100 may further include a substrate supporter 140 disposed to face the lid 120 while being spaced apart from the lid 120 by a predetermined distance. A substrate may be seated on the substrate supporter 140. The process chamber 100 may further include a seal ring 150 for maintaining a seal between the chamber body 110 and the lid 120, and an exhaust pump 160 coupled to the chamber body 110 in order to externally exhaust particles formed in the interior of the process chamber 100.

The chamber body 110 functions to support the lid 120. The inner space defined by the chamber body 110 and the lid 120 may be provided as a reaction space for substrate processing.

The lid 120 may function as a pathway for introducing process gas and/or purge gas for substrate processing (for example, thin film deposition, photolithography, etc.) into the process chamber 100.

The gas injector 130 is disposed under the lid 120. The plurality of gas injection holes H provided at the gas injector 130 functions to inject gas introduced through the lid 120 into a reaction space S.

The substrate supporter 140 functions to support a substrate within the process chamber 100.

The process chamber 100 may deposit a thin film having a uniform thickness through a process such as atomic layer deposition (ALD) or plasma enhanced atomic layer deposition (PEALD).

Although not shown, the process chamber 100 may be applied not only to a single type chamber configured to process a single substrate, but also to a batch type chamber configured to process a plurality of substrates.

The gas introduction apparatus 200 may include a gas introduction pipe 210, a plurality of gas suppliers 220, a gas feeding block 230, and a valve assembly 240.

The gas introduction pipe 210 may be coupled to at least a portion of the lid 120 such that the gas introduction pipe 210 communicates with the process chamber 100. In this case, the gas introduction pipe 210 may be made of a metal material having high durability. For example, the gas introduction pipe 210 may be made of steel use stainless (SUS).

The plurality of gas suppliers 220 is disposed outside the process chamber 100. The plurality of gas suppliers 220 may include a first gas supplier 221 for supplying process gas (hereinafter referred to as "first gas" for convenience of description), a second gas supplier 223 for supplying first purge gas (hereinafter referred to as "second gas" for convenience of description), and a third gas supplier 225 for supplying second purge gas (hereinafter referred to as "third gas" for convenience of description). Here, the first gas may include source gas or reactant gas. Inert gas such as argon (Ar), helium (He) or neon (Ne) or nitrogen ($N_2$), which does not chemically react with the first gas, may be used as the second gas and/or the third gas.

The gas feeding block 230 is disposed above the process chamber 100 provided with the reaction space S. The gas feeding block 230 may include a first body 231 having a rectangular parallelepiped shape at the entirety thereof, a plurality of gas channels 233 extending through the first body 231 while being connected in series to the plurality of gas suppliers 220, respectively, and a heater (not shown) for heating at least one of the plurality of gas channels 233.

First inlet 2311a, second inlet 2311b, and third inlet 2311c may be formed at one side surface of the first body 231 such that the inlet 2311a, second inlet 2311b, and third inlet 2311c communicate with the plurality of gas suppliers 220, respectively. First outlet 2313a, second outlet 2313b, and third outlet 2313c may be formed at the other side surface of the first body 231 such that the first outlet 2313a, second outlet 2313b, and third outlet 2313c communicate with the valve assembly 240.

In this case, the first body 231 may be made of a material. For example, the first body 231 may be made of at least one of aluminum (Al), steel use stainless (SUS), quartz, or ceramic, but the present disclosure is not limited thereto. In addition, the shape of the first body 231 is not limited to the above-described shape, and the first body 231 may have a column shape having a circular or polygonal cross-section.

The plurality of gas channels 233 may include first gas channel 2331, second gas channel 2333 and third gas channel 2335 respectively connected to the first gas supplier 221, second gas supplier 223 and third gas supplier 225. The first gas channel 2331, second gas channel 2333 and third gas channel 2335 may be disposed above the lid 120 while being spaced apart from one another in a first direction (y-axis direction) intersecting with a gas flow direction.

In this case, the third gas channel 2335 may be disposed between the first gas channel 2331 and the second gas channel 2333. The first gas channel 2331 may be disposed adjacent to the lid 120. That is, the first gas channel 2331, the third gas channel 2335 and the second gas channel 2333 are sequentially formed in this order in the first direction with reference to the lid 120 of the process chamber 100 such that the first gas channel 2331 is disposed nearest to the lid 120, and the second gas channel 2333 is disposed farthest from the lid 120.

This is because, when the first gas channel 2331 supplying process gas is disposed farther from the process chamber 100 than the second gas channel 2333 and/or the third gas channel 2335, process gas remaining between the first gas channel 2331 and the second gas channel 2333 and/or the third gas channel 2335 is insufficiently purged and, as such, particles may be accumulated within the gas feeding block 230, and the pathway of the first gas channel 2331 is lengthened, thereby resulting in degradation in productivity.

In addition, when the second gas channel 2333 always supplying the second purge gas in accordance with opening of a second valve 2433, which will be described later, is disposed nearer to the process chamber 100 than the first gas channel 2331 and/or the third gas channel 2335, a phenomenon in which the gas channel 233 is clogged may occur due to degradation in purge efficiency.

To this end, in accordance with embodiments of the present disclosure, the first gas channel 2331, the third gas channel 2335 and the second gas channel 2333 are sequentially disposed to be disposed nearer to the lid 120 of the process chamber 100 in this order and, as such, gas possibly remaining in each gas channel 233 may be efficiently purged. Accordingly, process efficiency may be maximized. The first gas channel 2331 may be formed to extend through the first body 231 in a second direction (x-axis direction) parallel to the gas flow direction between the first inlet 2311a and the first outlet 2313a.

The first gas channel 2331 may include first buffer space 2331a (also may be referred to as one portion of the first gas channel 2331) disposed adjacent to the gas introduction pipe 210, and the other portion 2331b disposed adjacent to the first gas supplier 221. The first buffer space 2331a and the other portion 2331b of the first gas channel 2331 may have different diameters, respectively. For example, the first gas channel 2331 may be designed such that first buffer space 2331a of the first gas channel 2331 has a greater diameter than the other portion 2331b of the first gas channel 2331.

A first buffer space 2331a, which expands outwards in a radial direction with respect to the other portion 2331b of the first gas channel 2331, may be one portion of the first gas channel 2331 in order to accumulate (to pile up) the first gas supplied from the first gas supplier 221 in a high concentration.

The growth rate of a thin film is determined based on an adsorption concentration (amount) of the first gas. In accordance with embodiments of the present disclosure, it may be possible to increase the growth rate of a thin film by forming, in the first gas channel 2331, the first buffer space 2331a capable of receiving the first gas in a relatively large amount, and supplying, to the first buffer space 2331a, the first gas previously accumulated in a high concentration for a predetermined time-divisional period through opening/closing operation of the valve assembly 240, which will be described later.

For example, the first buffer space 2331a may have a shape recessed stepwise with respect to the other portion 2331b of the first gas channel 2331 (cf. FIG. 1).

In another example, the first buffer space 2331a may have an inclined shape such that the diameter of the first buffer space 2331a increases gradually toward the first outlet 2313a. That is, the first buffer space 2331a may be formed to have inclinedly tapered shapes at opposite side surfaces thereof facing each other in a gas flow direction (cf. FIG. 2(a)).

Meanwhile, the volume (or capacity) of the first buffer space 2331a may be determined based on the volume of the reaction space S defined between the substrate supporter 140 and the lid 120.

The ratio of the volume of the first gas channel 2331 provided with the first buffer space 2331a to the volume of the reaction space S may be about 1.0 to 2.0, preferably, 1.2. This is because, when the volume ratio is less than 1.0, the concentration of the first gas introduced into the process chamber 100 may not satisfy a minimum concentration required for adsorption, thereby resulting in degradation in step coverage of the resultant thin film, whereas, when the volume ratio is more than 2.0, the predetermined time-divisional period taken for supply of the first gas is lengthened, thereby resulting in degradation in productivity.

To this end, a spacer block 235 may be provided at least one side of the first buffer space 2331a in order to variably adjust the volume of the first gas channel 2331 (cf. FIG. 2(b)). The spacer block 235 may be formed therein with a through hole (not shown), through which the first gas may flow, and may be made of the same material as the first body 231.

The second gas channel 2333 may be formed to extend through the first body 231 in the second direction (x-axis direction) parallel to the gas flow direction between the second inlet 2311b and the second outlet 2313b. In this case, the diameter of the second gas channel 2333 may be constant.

The third gas channel 2335 may be formed to extend through the first body 231 in the second direction (x-axis direction) parallel to the gas flow direction between the third inlet 2311c and the third outlet 2313c.

The third gas channel 2335 may include second buffer space 2335a (also may be referred to as one portion of the third gas channel 2335) disposed adjacent to the gas introduction pipe 210, and the other portion 2335b disposed adjacent to the third gas supplier 225. The second buffer space 2335a and the other portion 2335b of the third gas channel 2335 may have different diameters, respectively. For example, the third gas channel 2335 may be designed such that the second buffer space 2335a of the third gas channel 2335 has a greater diameter than the other portion 2335b of the third gas channel 2335.

A second buffer space 2335a, which expands outwards in a radial direction with respect to the other portion 2335b of the third gas channel 2335, may be one portion of the third gas channel 2335 in order to accumulate the third gas supplied from the third gas supplier 225. In this case, the second buffer space 2335a may have a shape recessed stepwise with respect to the other portion 2335b of the third gas channel 2335 or may have an inclined shape such that the diameter of the second buffer space 2335a increases gradually toward the third outlet 2313c, as described above.

The first buffer space 2331a and second buffer space 2335a may be identical to each other in terms of volume, length or diameter.

Alternatively, the first buffer space 2331a and second buffer space 2335a may differ from each other in terms of at least one of volume, length or diameter. In this case, the relative volumes of the first buffer space 2331a and second buffer space 2335a may be determined based on the distances of the first buffer space 2331a and second buffer space 2335a from the lid 120. For example, the first buffer space 2331a disposed nearer to the lid 120 from among the plurality of buffer spaces 2331a and 2335a may be formed to have a greater volume in order to increase the growth rate of a thin film according to the first gas which is adsorbed to the substrate or reacts with the substrate. On the contrary, the second buffer space 2335a disposed farther from the lid 120 from among the plurality of buffer spaces 2331a and 2335a may be formed to have a greater volume in order to reduce a purge time, thereby resulting in an enhancement in total productivity.

The valve assembly 240 may selectively control supply of the first to third gases in a time-division manner based on a control signal from a mass flow controller (not shown).

The valve assembly 240 may include a second body 241, a plurality of valves 243 attached to the second body 241 in order to selectively open/close at least one of the plurality of gas channels 233, and a plurality of channels 245 each formed to extend through the second body 241 and at least a portion of a corresponding one of the plurality of valves 243. The valve assembly 240 may further include a heater (not shown) mounted in the second body 241 in order to heat at least one of the plurality of channels 245.

The valve assembly 240 may be coupled to at least one side surface of the gas feeding block 230 such that the valve assembly 240 is disposed near the lid 120 communicating with the gas introduction pipe 210.

The second body 241 is coupled to the first body 231 by a fastener 250. First inlet 2411a, second inlet 2411b, and third inlet 2411c are formed at one side surface of the second body 241 such that the first inlet 2411a, second inlet 2411b, and third inlet 2411c communicate with the first gas channel 2331, second gas channel 2333 and third gas channel 2335, respectively. The plurality of valves 243 is attached to the other side surface of the second body 241. In addition, a single outlet 2413 is formed at a lower portion of the second body 241 such that the outlet 2413 communicates with the gas introduction pipe 210.

The second body 241 may be made of the same material as the first body 231. For example, the second body 241 may be made of at least one of aluminum (Al), steel use stainless (SUS), quartz, or ceramic.

The plurality of valves 243 may include first valve 2431, second valve 2433 and third valve 2435 inter-connected in parallel. A sealing member (not shown) may be provided at a boundary surface, at which the second body 241 and the plurality of valves 243 contact each other, in order to securely maintain the pressure and seal of gas flowing through the valves 243.

The first valve 2431, second valve 2433 and third valve 2435 may selectively open/close at least one of the plurality of gas channels 233 such that at least one gas is supplied to the process chamber 100 in accordance with a predetermined cycle.

The first valve 2431 controls flow of the first gas flowing along the first gas channel 2331. When a substrate processing process is executed, the first valve 2431 is opened such that the first gas is introduced into the process chamber 100 via the gas introduction pipe 210. The first gas introduced into the process chamber 100 is adsorbed onto the substrate or reacts with the substrate in accordance with operation of the gas injector 130. After supply of the first gas for a predetermined first period T1, the first valve 2431 is closed in order to prevent further introduction of the first gas. When the first valve 2431 is closed, the first gas may be accumulated in a high concentration in the first buffer space 2331a.

The second valve 2433 communicates with the second gas channel 2333, and may always be maintained in an opened state such that the second gas is always introduced into the process chamber 100. In this case, the second gas may be used as carrier gas for enhancing feeding efficiency such that the first gas or the third gas can be smoothly fed.

The third valve 2435 controls flow of the third gas flowing along the third gas channel 2335, and may be opened or closed alternately with the first valve 2431. For the predetermined first period T1 in which the first gas is supplied, the third valve 2435 may be closed, and the third gas is accumulated in the second buffer space 2335a. When supply of the first gas is subsequently stopped, the third valve 2435 is opened, and the third gas accumulated in the second buffer space 2335a is introduced into the process chamber 100 for a predetermined second period T2. The second gas introduced into the process chamber 100 purges the first gas remaining on the substrate in a gas phase.

Each of the plurality of channels 245 is formed to extend through the second body 241 and at least a portion of the corresponding one of the plurality of valves 243 in order to enable the plurality of gas channels 233 and the plurality of valves 243 to communicate with each other. This will be described in detail later with reference to FIG. 3.

Referring to FIG. 3(a), the plurality of channels 245 may include first channel 2451, second channel 2452 and third channel 2453 respectively communicating with the first gas channel 2331, second gas channel 2333 and third gas channel 2335, and fourth channel 2454, fifth channel 2455 and sixth channel 2456 respectively enabling the gas introduction pipe 210 to communicate with the first valve 2431, second valve 2433 and third valve 2435.

The first channel 2451 communicates with the first gas channel 2331 while extending to a first branch point b1 at which the first valve 2431 is installed. The first channel 2451 is formed to extend through the entire portion of the second body 241 and a portion of the first valve 2431.

The second channel 2452 communicates with the second gas channel 2333 while extending to a second branch point b2 at which the second valve 2433 is installed. The second channel 2452 is formed to extend through the entire portion of the second body 241 and a portion of the second valve 2433.

The third channel 2453 communicates with the third gas channel 2335 while extending to a third branch point b3 at which the third valve 2435 is installed. The third channel 2453 is formed to extend through the entire portion of the second body 241 and a portion of the third valve 2435.

The fourth channel 2454, fifth channel 2455 and sixth channel 2456 may be disposed in a zigzag manner in the second body 241 and respective corresponding ones of the plurality of valves 243 in order to achieve efficient space use.

The fourth channel 2454 extends through a portion of the second body 241 and a portion of the second valve 2433 while being formed to have a U shape or a V shape in order to inter-connect the second channel 2452 and the third channel 2453.

The fifth channel 2455 extends through a portion of the second body 241 and a portion of the third valve 2435 while being formed to have a U shape or a V shape in order to inter-connect the third channel 2453 and the first channel 2451.

The sixth channel 2456 extends through a portion of the second body 241 and a portion of the first valve 2431 while being formed to have a curved portion in order to inter-connect the first channel 2451 and the gas introduction pipe 210.

Referring to FIGS. 3(a) and 3(b), when the first valve 2431 is opened for the predetermined first period T1, the first gas in a high concentration accumulated in the first buffer space 2331a is introduced into the gas introduction pipe 210 via the first channel 2451 and sixth channel 2456. In this case, the second valve 2433, which is always maintained in an opened state, allows flow of the second gas such that the first gas can be smoothly fed. The second gas joins the first gas at the first branch point b1 after passing through the second channel 2452, fourth channel 2454 and fifth channel 2455, and is then introduced into the gas introduction pipe 210. In this case, the third valve 2435 is in a closed state for the first period T1, and the third gas is accumulated in the second buffer space 2335a.

When the third valve 2435 is opened for the predetermined second period T2, the third gas accumulated in the second buffer space 2335a is introduced into the gas introduction pipe 210 via the third channel 2453, fifth channel 2455 and sixth channel 2456. In this case, the second valve 2433, which is always maintained in an opened state, allows flow of the second gas such that the third gas can be smoothly fed. The second gas joins the third gas at the third branch point b3 after passing through the second channel 2452 and fourth channel 2454, and is then introduced into the gas introduction pipe 210. In this case, the first valve 2431 is in a closed state for the second period T2, and the first gas in a high concentration is accumulated in the first buffer space 2331a.

In accordance with an embodiment, in the gas introduction apparatus 200, the first gas channel 2331 may be disposed near the lid 120 such that the pathway of the first gas contributing to thin film formation from among the pathways of the first to third gases is set to have a minimum length. In addition, the plurality of valves 243, which selectively prevent flow of gas, may be disposed between the lid 120 and the gas feeding block 230 in order to achieve accumulation of gas in advance in a rest period and immediate supply of gas required in each processing step.

In addition, the buffer spaces 2331a and 2335a, which can receive gas in a large amount, may be formed in at least one of the plurality of gas channels 233 in order to enhance adsorption, reaction or purge efficiency. Furthermore, the buffer spaces 2331a and 2335a may be disposed adjacent to the gas introduction pipe 210 in order to achieve a reduction in process (or purge) time. Accordingly, it may be possible to secure a desired thin film deposition rate and thin film thickness uniformity and to maximize total productivity.

Figure 4:
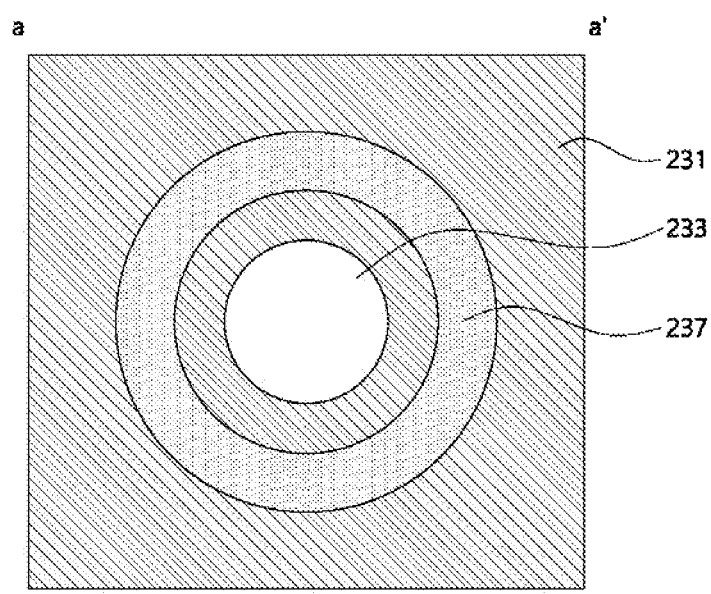
FIG. 4 is a cross-sectional view of the gas introduction apparatus taken along line a-a' in FIG. 1.

FIG. 4 is a cross-sectional view of the gas introduction apparatus taken along line a-a' in FIG. 1.

Referring to FIG. 4, a heater 237 may be provided at a surface of the gas feeding block 230 and/or an interior of the gas feeding block 230 in order to heat at least one of the plurality of gas channels 233.

The heater 237 may supply predetermined heat such that at least one of the first to third gases flowing through the plurality of gas channels 233 is maintained at a predetermined temperature. The heater 237 may be constituted by a planar heating element exhibiting uniform temperature distribution and, as such, heating portions of the heater 237 may be uniformly distributed over the entire area of the heater 237.

Generally, conventional heaters (not shown) are formed to have a structure surrounding a gas line (not shown) having a pipe shape. As a result, the heat transfer path conducting heat to gas is lengthened, thereby resulting in efficiency degradation. Furthermore, heat is locally transferred to the gas line (not shown). For this reason, there is a limitation in maintaining gas at a uniform temperature. In particular, when the temperature of gas is non-uniform, the phase of the gas may be changed and, as such, the gas line (not shown) may be clogged, and undesired particles may be formed. As a result, there may be adverse effects on the quality and productivity of the resultant thin film.

To this end, in accordance with an embodiment of the present disclosure, the heater 237 may be formed to have a structure built (or embedded) in the gas feeding block 230, differently from the conventional heaters (not shown). When the heater 237 is embedded in the gas feeding block 230, heat supplied from the heater 237 may be conducted to the entire portion of the first body 231 and, as such, the temperature of gas flowing along the gas channel 233 may be maintained at a uniform temperature. In addition, as a separate gas line (not shown) is eliminated, the heater 237 may be disposed nearer to gas and, as such, an effect of enhancing heat transfer efficiency may be obtained.

The heater 237 as described above may be disposed in the first body 231 to be radially outwardly spaced apart from the gas channel 233 while being formed to have a shape corresponding to the circumference of the gas channel 233. Of course, embodiments of the present disclosure are not limited to the above-described conditions. For example, the heater 237 may be disposed at the surface of the first body 231 or may not be formed at the entire section of the gas channel 233, but may be formed only at a section of the gas channel 233.

The heater 231 may include a plurality of heaters respectively installed at all of the gas channels 233 while being formed along respective circumferences of the gas channels 233. In this case, the plurality of heaters may be controlled to be maintained at the same temperature. Alternatively, the plurality of heaters may be controlled to be maintained at different temperatures, respectively, in order to maintain temperatures suitable for respective processing steps (adsorption, purge, reaction, etc.). For example, the heater disposed adjacent to the first gas channel 2331 for the first gas requiring thermal decomposition or chemical reaction may be controlled to be maintained at a higher temperature than the remaining heaters.

Alternatively, the heater 237 may be installed at a part of the first gas channel 2331, second gas channel 2333 and third gas channel 2335 in order to heat only a particular gas channel.

Otherwise, the heater 237 may be disposed among the first gas channel 2331, second gas channel 2333 and third gas channel 2335 in order to simultaneously heat the adjacent gas channels 233. In this case, accordingly, the temperature difference among the plurality of gas channels 233 may be minimized.

Thus, the heater 237 provided at the surface of the first body 231 and/or the interior of the first body 231 adjusts the temperature of gas flowing along the gas channel 233 and, as such, may achieve an enhancement in the efficiency of a reaction in the process chamber 100 while preventing generation of an abnormal reaction caused by cooling, etc.

The heater 237 as described above may be applied to the surface of the valve assembly 240 and/or the interior of the valve assembly 240 in the same manner as described above. In this case, the heater 237 may heat at least one of the first to third gases flowing through the plurality of channels 245. No description will be given of this configuration in order to avoid overlapping description of identical contents.

The substrate processing apparatus according to the above-described embodiment may be used in processes of manufacturing a flat display device, a solar cell, etc. as well as a process of depositing a thin film on a substrate of a semiconductor device.

In accordance with embodiments of the present disclosure, a buffer space, which can receive gas in a large amount, may be formed in a gas channel, and a valve may be disposed adjacent to a channel connected to a chamber. Accordingly, it may be possible to secure a desired thin film deposition rate and thin film thickness uniformity and to maximize total productivity.

Effects attainable in the present disclosure are not limited to the above-described effects, and other effects of the present disclosure not yet described will be more clearly understood by those skilled in the art from the above detailed description.

Although several embodiments have been described, other embodiments may be implemented in various forms. The technical contents of the above-described embodiments may be combined in various forms, so long as there is compatibility thereamong, and new embodiments may be implemented through such combination.

Those skilled in the art to which the present disclosure pertains can appreciate that the present disclosure may be embodied in other specific forms without changing the technical spirit or essential characteristics. Therefore, the above detailed description should be understood as exemplary rather than limiting in all aspects. The scope of the present disclosure should also be interpreted by the claims below. All modifications as would be derived from the equivalent concept intended to be included within the scope of the present disclosure should also be interpreted as falling within the scope of the present disclosure.

The invention claimed is:

1. A gas introduction apparatus comprising: a gas feeding block disposed above a chamber, the gas feeding block comprising a plurality of gas channels disposed therein to supply a gas to the chamber; a valve assembly coupled to one side surface of the gas feeding block, the valve assembly comprising a plurality of valves for selectively opening/closing at least one of the plurality of gas channels; and a gas introduction pipe coupled, at one end thereof, to the valve assembly while communicating with the chamber at the other end thereof, wherein a buffer space is provided in at least one of the plurality of gas channels such that the buffer space expands outward with respect to an end portion of one of the plurality of gas channels and is disposed adjacent to the gas introduction pipe, to accumulate the gas.

2. The gas introduction apparatus according to claim 1,
wherein the gas comprises a process gas and a purge gas; and
wherein a gas channel supplying the process gas from among the plurality of gas channels is disposed nearer to the chamber than the gas channel supplying a purge gas from among the plurality of gas channels.

3. The gas introduction apparatus according to claim 1, wherein the plurality of gas channels comprises:
a first gas channel for supplying a process gas,
a second gas channel for supplying a first purge gas, and
a third gas channel for supplying a second purge gas,
wherein the third gas channel is disposed between the first gas channel and the second gas channel.

4. The gas introduction apparatus according to claim 3, wherein
the buffer space comprises:
a first buffer space provided at the first gas channel, and
a second buffer space provided at the third gas channel,
wherein the first and second buffer spaces differ from each other in terms of at least one of volume, length or diameter.

5. The gas introduction apparatus according to claim 3, wherein the second gas channel has a smaller volume than the first and third gas channels.

6. The gas introduction apparatus according to claim 1, wherein the gas feeding block further comprises a heater for heating at least one of the plurality of gas channels.

7. The gas introduction apparatus according to claim 1, wherein the gas feeding block further comprises a spacer block disposed at least one side of the buffer space to variably adjust a volume of at least one of the plurality of gas channels.

8. A substrate processing apparatus comprising:
a process chamber providing a reaction space; and
the gas introduction apparatus as defined in claim 1,
wherein the process chamber comprises:
a substrate supporter for supporting a substrate;
a gas injector disposed to face the substrate supporter, the gas injector injecting a gas onto the substrate, and
a lid formed at one surface of the gas injector.

9. The substrate processing apparatus according to claim 8, wherein the at least one of the plurality of gas channels provided with the buffer space has a volume greater than a volume between the substrate supporter and the lid.

* * * * *